United States Patent
Ganguly et al.

(10) Patent No.: US 7,668,856 B2
(45) Date of Patent: Feb. 23, 2010

(54) METHOD FOR DISTINCT COUNT ESTIMATION OVER JOINS OF CONTINUOUS UPDATE STREAM

(75) Inventors: Sumit Ganguly, Bhopal (IN); Minos N. Garofalakis, Morristown, NJ (US); Amit Kumar, New Delhi (IN); Rajeev Rastogi, New Providence, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 874 days.

(21) Appl. No.: 10/957,185

(22) Filed: Sep. 30, 2004
(Under 37 CFR 1.47)

(65) Prior Publication Data

US 2006/0085592 A1  Apr. 20, 2006

(51) Int. Cl.
*G06F 7/00* (2006.01)
(52) U.S. Cl. ...................................... 707/102
(58) Field of Classification Search ................ 707/102, 707/4, 3
See application file for complete search history.

(56) References Cited

U.S. PATENT DOCUMENTS

| | | | | |
|---|---|---|---|---|
| 5,857,180 | A * | 1/1999 | Hallmark et al. | 707/2 |
| 5,960,434 | A * | 9/1999 | Schimmel | 707/100 |
| 6,115,705 | A * | 9/2000 | Larson | 707/3 |
| 6,134,546 | A * | 10/2000 | Bestgen et al. | 707/4 |
| 6,339,772 | B1 * | 1/2002 | Klein et al. | 707/4 |
| 6,604,102 | B2 * | 8/2003 | Klein et al. | 707/4 |
| 6,694,322 | B2 * | 2/2004 | Warren et al. | 707/101 |
| 6,912,524 | B2 * | 6/2005 | Acharya et al. | 707/3 |
| 7,085,911 | B2 * | 8/2006 | Sachedina et al. | 711/206 |
| 7,110,540 | B2 * | 9/2006 | Rajagopal et al. | 380/44 |
| 2002/0038313 | A1 * | 3/2002 | Klein et al. | 707/200 |
| 2004/0243563 | A1 * | 12/2004 | Heiner et al. | 707/3 |
| 2005/0091238 | A1 * | 4/2005 | Zane et al. | 707/100 |

OTHER PUBLICATIONS

S. Ganguly, M. Garofalakis, and R. Rastogi. "Processing Set Expressions over Continuous Update Streams": In SIGMOD, Jun. 9-12, 2003.*

"NetFlow Services and Applications". Cisco Systems White Paper (http://www.cisco.com), 1999.

B. Babcock and C. Olston. "Distributed Top-K Monitoring". In *SIGMOD*, 2003.

M. Charikar, K. Chen, and M. Farach-Colton. "Finding Frequent Items in Data Streams". In ICALP, 2002.

C. Cranor, T. Johnson, O. Spatscheck, and V. Shkapenyuk. "Gigascope: A Stream Database for Network Applications". In *SIGMOD*, 2003.

(Continued)

*Primary Examiner*—John E Breene
*Assistant Examiner*—Joshua Bullock
(74) *Attorney, Agent, or Firm*—Wall & Tong LLP (57) ABSTRACT

The invention provides methods and systems for summarizing multiple continuous update streams such that an approximate answer to a query over one or more of the continuous update streams (such as a Query requiring a join operation followed by a duplicate elimination step) may be rapidly provided. The systems and methods use multiple (parallel) Join Distinct (JD) Sketch data structures corresponding to hash buckets of at least one initial attribute.

15 Claims, 4 Drawing Sheets

JD Sketch Synopsis for Stream R (A,B).

OTHER PUBLICATIONS

A. Das, S. Ganguly, M. Garofalakis, and R. Rastogi. "Distributed Set-Expression Cardinality Estimation". Bell Labs Tech. Memorandum, 2003.

S. Ganguly, M. Garofalakis, and R. Rastogi. "Processing Set Expressions over Continuous Update Streams": In *SIGMOD*, 2003.

P.B. Gibbons. "Distinct Sampling for Highly-Accurate Answers to Distinct Values Queries and Event Reports". In *VLDB*, 2001.

P.B. Gibbons and S. Tirthapura. "Distributed Streams Algorithms for Sliding Windows". In *SPAA*, 2002.

A. C. Gilbert, Y. Kotidis, S. Muthukrishan, and M.J. Strauss. "How to Summarize the Universe: Dynamic Maintenance of Quantiles". In *VLDB*, 2002.

S. Madden, M. J. Franklin, J. H. Hellerstein, and W. Hong. "The Design of an Acquisitional Query Processor for Sensor Networks". In *SIGMOD*, 2003.

D. Moore, G.M. Voelker, and S. Savage. "Inferring Internet Denial-of-Service Activity". In *USENIX Security Symposium*, 2001.

C. Olston, J. Jiang, and J. Widom. "Adaptive Filters for Continuous Queries over Distributed Data Streams". In *SIGMOD*, 2003.

G. Pottie and W. Kaiser. "Wireless Integrated Network Sensors". Communications of the ACM, 43(5), 2000.

\* cited by examiner

FIG. 1

The 2-level Hash Sketch Synopsis Structure.

JD Sketch Synopsis for Stream R (A,B).

procedure Compose( $\mathcal{X}_{A,B}, \mathcal{X}_{C,B}$ )
Input: Pair of parallel JD sketch synopses for update
   streams R(A, B), S(B, C).
Output: Bitmap-sketch $\mathcal{Y}_{A,C}$ on $(A, C)$ value pairs in R⋈S
begin
1.  $\mathcal{Y}_{A,C} := [\, 0, \cdots, 0\, ]$   // initialize
2.  for each bucket $k$ of $\mathcal{X}_{A,B}$ do
3.     for each bucket $l \neq k$ of $\mathcal{X}_{C,B}$ do
4.        if IntersectionEstimator($\mathcal{X}_{A,B}[k], \mathcal{X}_{C,B}[l]) \geq 1$ then
5.           $\mathcal{Y}_{A,C}[\min\{k,l\}] := 1$
6.  return($\mathcal{Y}_{A,C}$)
end

JD Sketch Composition Algorithm.

FIG. 4 procedure JDEstimator( $(\mathcal{X}^i_{A,B}, \mathcal{X}^i_{C,B}), i = 1, \ldots, s_2, \epsilon$ )
Input: $s_2$ independent pairs of parallel JD sketch synopses
   $(\mathcal{X}^i_{A,B}, \mathcal{X}^i_{C,B})$ for the update streams R(A, B), S(B, C).
Output: $(\epsilon, \delta)$-estimate for $|\pi_{A,C}(\text{R}(A, B) \bowtie \text{S}(B, C))|$.
begin
1.  for $i := 1$ to $s_2$ do
2.     $\mathcal{Y}^i_{A,C} := \text{Compose}(\mathcal{X}^i_{A,B}, \mathcal{X}^i_{C,B})$
3.  let $B$ denote the highest bucket index in the $\mathcal{Y}_{A,C}$ synopses
4.  for index := $B$ downto 0 do
5.     count := 0
6.     for $i := 1$ to $s_2$ do
7.        if $\mathcal{Y}^i_{A,C}[\text{index}] = 1$ then count := count +1
8.     endfor
9.     if $\left( (1 - 2\epsilon)\frac{\epsilon}{8} \leq \frac{\text{count}}{s_2} \leq (1 + \epsilon)\epsilon \right)$ then
10.       return( count/($p_{\text{index}} \cdot s_2$) )
11. endfor
12. return( fail )
end

Join-Distinct Estimation Algorithm.

FIG. 5

METHOD FOR DISTINCT COUNT ESTIMATION OVER JOINS OF CONTINUOUS UPDATE STREAM

FIELD OF THE INVENTION

The invention relates generally to information processing systems and, more particularly, to database query processing over continuous streams of update operations.

BACKGROUND OF THE INVENTION

Query-processing algorithms for conventional Database Management Systems (DBMS) typically rely on several passes over a collection of static data sets in order to produce an accurate answer to a user query. However, there is growing interest in algorithms for processing and querying continuous data streams (i.e., data that is seen only once in a fixed order) with limited memory resources. These streams in general comprise update operations (insertions, deletions and the like).

Providing even approximate answers to queries over continuous data streams is a requirement for many application environments; examples include large IP network installations where performance data from different parts of the network needs to be continuously collected and analyzed. A large network processes data traffic and provides measurements of network performance, network routing decisions and the like. Other application domains giving rise to continuous and massive update streams include retail-chain transaction processing (e.g., purchase and sale records), ATM and credit-card operations, logging Web-server usage records, and the like.

For example, assume that each of two routers within the network provides a respective update stream indicative of packet related data, router behavior data and the like. It may be desirable for the data streams from each of the two routers to be correlated. Traditionally, such streams are correlated using a JOIN operation, which is used to determine, for example, how many of the tuples associated with routers R1 and R2 have the same destination IP address (or some other inquiry). In the case of this JOIN query, the two data sets (i.e., those associated with R1 and R2) are joined and the size of the relevant joined set is determined (e.g., how many of the tuples have the same destination address).

The ability to estimate the number of distinct (sub)tuples in the result of a join operation correlating two data streams (i.e., the cardinality of a projection with duplicate elimination over a join) is an important goal. Unfortunately, existing query processing solutions are unable to provide sufficient responses to complex "Join-Distinct" estimation problems over data streams.

SUMMARY OF THE INVENTION

Various deficiencies in the prior art are addressed by a novel method and data structure for summarizing a continuous update stream. Where the data structure is used to summarize multiple continuous update streams, approximate answers to Join-Distinct (JD) queries and other queries may be rapidly provided. Improved accuracy in query response is achieved in one embodiment by summarizing multiple continuous data streams using corresponding multiple (parallel) JD Sketch data structures. One embodiment of the invention is directed to determining a "distinct" join aggregate. That is, the invention operates to perform a join operation, then apply a duplicate elimination step to count the number of distinct tuples produced by the join operation.

Specifically, a method according to one embodiment of the invention comprises maintaining a summary of a first continuous stream of tuples by hashing tuples received from the first continuous data stream according to at least one initial attribute; and for each bucket of the at least one initial attribute, generating a corresponding set of 2-level hash sketches according to at least one other attribute.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The invention will be described within the context of a computer or communications network in which the provisioning and relationships of various routers and other data are of interest. It will be appreciated that the invention is broadly applicable to any system or application domain in which the efficient summarizing and, optionally, Join-Distinct (JD) query processing of multiple continuous update data streams is desired.

Briefly, presented herein is a space-efficient algorithmic solution to the general Join-Distinct cardinality estimation problem over continuous update streams. The proposed estimators are probabilistic in nature and rely on novel algorithms for building and combining a new class of hash-based synopses, termed "JD sketches", that are useful in summarizing update streams. Also presented are novel estimation algorithms that use the JD sketch synopses to provide low error, high-confidence Join-Distinct estimates using only small space and small processing time per update.

First, the JD sketch synopsis data structure is introduced and its maintenance over a continuous stream of updates (rendering a multi-set of data tuples) is described. Briefly, the JD synopses make use of 2-level hash sketch structures while imposing an additional level of hashing that is adapted to effectively project and count on the attributes in the distinct-count clause. The JD sketch synopses never require rescanning or re-sampling of past stream items, regardless of the deletions in the stream: at any point in time, the synopsis structure is guaranteed to be identical to that obtained if the deleted items had never occurred in the stream. The JD sketch synopses are used to summarize multiple continuous data streams such that approximate answers to Join-Distinct queries and other queries may be rapidly provided.

Second, based on the JD sketch synopses, a novel probabilistic algorithm for estimating Join-Distinct cardinalities over update streams is provided. That is, the invention operates to perform a join operation, then apply a duplicate elimination step to count the number of distinct tuples produced by the join operation. A key element of the solution is a new technique for intelligently composing independently-built JD sketches (on different tuple streams) to obtain an estimate for the cardinality of their Join-Distinct result. The invention provides a novel approach to solve this difficult estimation problem in the context of a data-streaming or update-streaming model. Furthermore, even though the estimators are presented in a single-site setting, the invention may be extended to the more general distributed-stream model.

A method according to an embodiment of the invention operates to build small space summaries of each of the update streams of interest. That is, as the individual update records or tuples stream by, a small space summary of these records/tuples is built and maintained for each stream. The small space summary for each stream is supported by a respective plurality (e.g., Z) of a new data structure denoted by the inventors as a JD Sketch synopsis. In response to a user query, the invention operates to process the small space summaries (i.e., the Z parallel JD Sketch data structures) of the streams relevant to the user query according to a Join-Distinct operation to provide thereby very good approximate response(s) to the query.

Each of the Z JD Sketch data structures associated with any update stream represents a respective synopsis of that update stream up to a particular point in time. Each of the Z JD Sketch data structures ($JDS_1$-$JDS_Z$) is determined in a consistent manner between streams. That is, assuming two streams of interest, the first JD Sketch $JDS_1$ of a first stream STREAM1 is constructed in the same manner as the first JD Sketch $JDS_1$ of a second stream STREAM2, the second JD Sketch $JDS_2$ of the first stream STREAM1 is constructed in the same manner as the second JD Sketch $JDS_2$ of the second stream STREAM2 and so on. Thus, each of the records or tuples received from an update stream is hashed and stored according to each of the Z JD Sketch synopsis. The Z JD Sketches associated with each update stream forms a small space summary of that update stream.

The JD Sketch data structure is not a standard hash table. It may be conceptualized as a hash table having buckets which additionally include second level hash structures adapted to capture information pertaining to the set of elements of a stream. That is, only a summary of the set of information mapping to each hash table bucket is actually kept in the bucket. This summary hash table bucket summary may comprise, illustratively, a set of 2-level hash sketch synopses. Thus, each hash table bucket stores a corresponding set of hash tables of those data elements that map or "collide" into the hash table bucket.

As previously noted, each of the corresponding 1-Z JD Sketch data structures maintained for each stream is constructed in the same manner. That is, for each of the update streams, their small space summaries are built using corresponding JD Sketch data structures. Specifically, the first level hash function and set of second level hash functions for a first JD Sketch data structure JDS1 of a first stream STREAM1 corresponds to the first level hash function and set of second level hash functions for a first JD Sketch data structure JDS1 of a second stream STREAM2 (and so on). Such corresponding JD Sketch pairs are herein referred to as parallel JD Sketch pairs.

In their most general form, data base data streams are actually update streams; that is, the stream is a sequence of updates to data items, comprising data-item deletions as well as insertions. Such continuous update streams arise naturally, for example, in the network installations of large Internet service providers, where detailed usage information (SNMP/RMON packet-flow data, active VPN circuits, etc.) from different parts of the underlying network needs to be continuously collected and analyzed for interesting trends.

The processing of such streams follows, in general, a distributed model where each stream (or, part of a stream) is observed and summarized by its respective party (e.g., the element-management system of an individual IP router) and the resulting synopses are then collected (e.g., periodically) at a central site, where queries over the entire collection of streams can be processed. This model is used, for example, in the Interprenet IP network monitoring product provided by Lucent Technologies, Inc., of Murray Hill, N.J.

There are several forms of queries that users or applications may wish to pose (online) over such continuous update streams; examples include join or multi-join aggregates, norm and quantile estimation, or histogram and wavelet computation. Estimating the number of distinct (sub)tuples in the result of an equi-join operation correlating two update streams (i.e., the cardinality of a projection with duplicate elimination over a join) is one of the fundamental queries of interest for several data-analysis scenarios.

As an example, a network-management application monitoring active IP-sessions may wish to correlate the active sessions at routers R1 and R2 by posing a query such as: "What is the number of distinct (source, destination) IP-address pairs seen in packets routed through R1 such that the source address is also seen in packets routed by R2?" Such a query would be used, for example, when trying to determine the load imposed on a core router R1 by the set of customers connected to a specific router R2 at the edge of the network. This query may be described as the number of distinct tuples in the output of the following project-join query, where $R_i(sour_i,dest_i)$ denotes the multi-set of source-destination address pairs observed in the packet stream through a router $R_i$, as follows:

$$\pi_{sour_1,dest_1}(R_1(sour_1,dest_1) \bowtie_{sour_1=sour_2} R_2(sour_2,dest_2))$$

The ability to provide effective estimates for the cardinality of such "Join-Distinct" query expressions over the observed IP-session data streams in the underlying network can be crucial in quickly detecting possible denial-of-service attacks, network routing or load-balancing problems, potential reliability concerns (catastrophic points-of-failure), and so on. Join-Distinct queries are also an integral part of query languages for relational database systems (e.g., the DISTINCT clause in the SQL standard). Thus, one-pass synopses for effectively estimating Join-Distinct cardinalities can be extremely useful, e.g., in the optimization of such queries over Terabyte relational databases.

Figure 1:
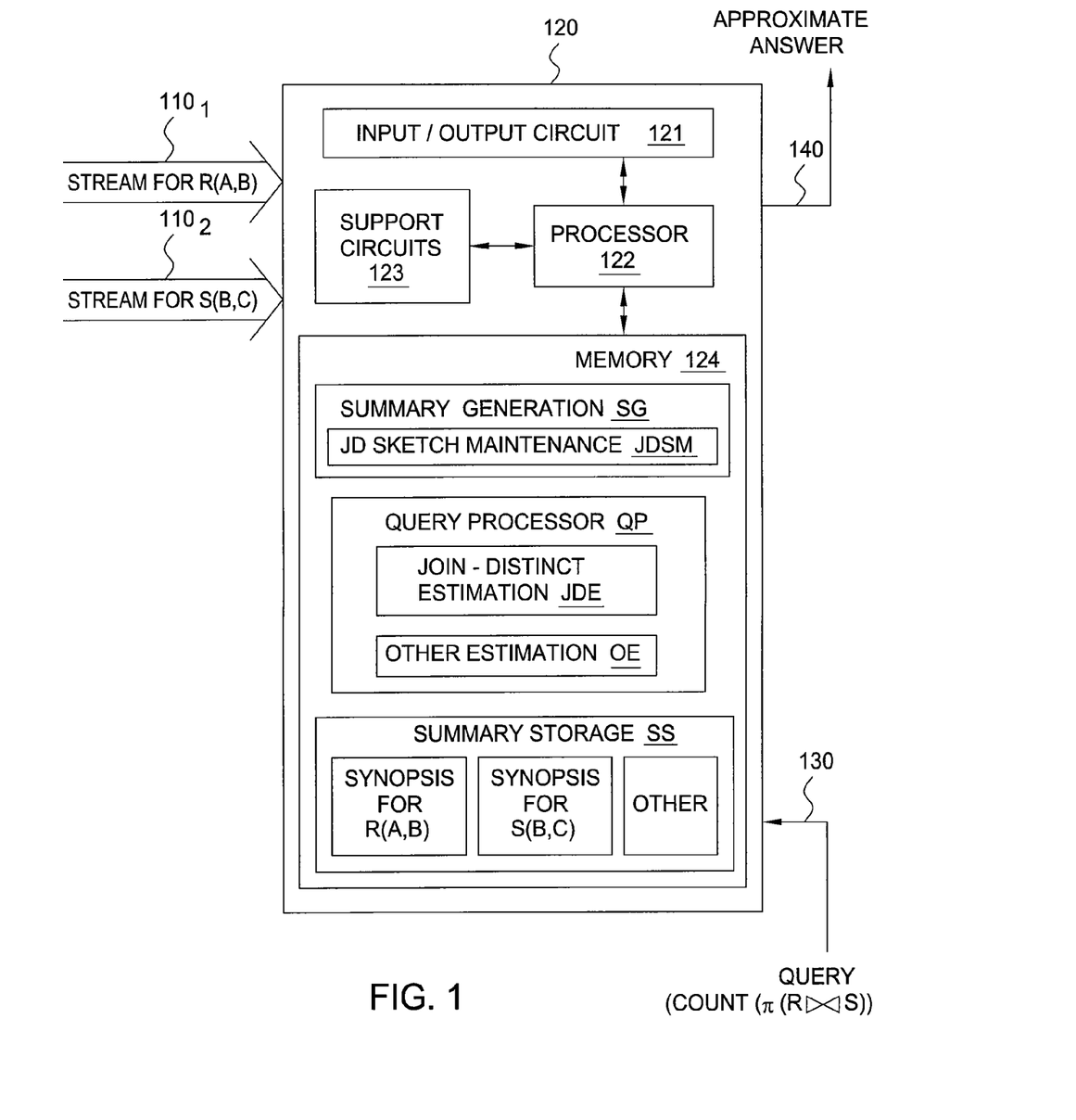
FIG. 1 depicts an Update-Stream Processing Architecture according to an embodiment of the present invention.

FIG. 1 depicts an Update-Stream Processing Architecture according to an embodiment of the present invention. The architecture of FIG. 1 is presented as a general purpose computing element adapted to perform the various stream processing tasks described herein. It will be appreciated by those skilled in the art and informed by the present invention that the architecture of FIG. 1 may be usefully employed within the context of a network management system at a Network Management Layer, an Element Management Layer or some other level. Moreover, while not discussed in detail herein, appropriate systems and apparatus for practicing the data structures, methodology and other aspects of the invention may be found in any system benefiting from the data processing and other techniques described herein.

Specifically, FIG. 1 comprises an update-stream processing architecture 120 including a processor 122 as well as memory 124 for storing various control programs and other programs as well as data. The memory 124 may also store an operating system supporting the various programs.

The processor 122 cooperates with conventional support circuitry such as power supplies, clock circuits, cache memory and the like as well as circuits that assist in executing the software routine stored in the memory 124. As such, it is contemplated that some of the steps discussed herein as software processes may be implemented within hardware, for example as circuitry that cooperates with the processor 122 to perform various steps. The processing architecture 120 also contains input/output (I/O) circuitry 121 which forms an interface between the various functional elements communicating with the architecture 120.

The architecture 120 may be advantageously employed within the context of a network management system (NMS), an element management system (EMS) or any other network management system. Similarly, the invention has broad applicability to any system in which large amounts of data must be rapidly processed within the context of update streams.

The invention may be implemented as a computer program product wherein computer instructions, when processed by a computer, adapt the operation of the computer such that the methods, data structures and/or techniques of the present invention are invoked or otherwise provided. Instructions for invoking the inventive methods may be stored in fixed or removable media, transmitted via a data stream in a broadcast media, and/or stored within a working memory within a computing device operating according to the instructions.

In an embodiment of the invention depicted in FIG. 1, a first update-stream $110_1$ is associated with a first multi-set of relational tuples R(A,B), while a second update-stream $110_2$ is associated with a second multi-set of relational tuples denoted as S(B,C). The update-stream processing architecture 120 processes the two update streams $110_1$ through $110_2$ to produce corresponding summaries. The corresponding summaries are the processed in response to, illustratively, a user query 130 to provide therefrom an approximate answer 140.

Memory 124 is depicted as including a summary generation SG algorithm is utilized to provide summary information pertaining to the received update streams, illustratively a JD sketch maintenance algorithm JDSM. The summary (sets of parallel JD sketch pairs) for each of the update streams $110_1$, $110_2$ is stored within summary storage SS within memory 124. As depicted in FIG. 1, the summary storage SS includes a synopsis for stream R(A,B), a synopsis for stream S(B,C) and, optionally, a synopsis for other update streams. Thus, while the architecture of FIG. 1 is depicted as processing two update streams, more update streams may be summarized and otherwise processed in accordance with the present invention.

Memory 124 is also depicted as including a query processor QP including a join-distinct estimation algorithm (JDE) as well as another estimation algorithm OE. The JDE algorithm also utilizes a JD Sketch composition algorithm. Thus, summaries in the form of JD Sketches are generated/maintained by the summary generation SG algorithm. The summaries/JD Sketches are then composed and otherwise utilized by the JDE algorithm to respond to queries.

It will be appreciated by those skilled in the art and informed by the teachings of the present invention that while the memory 124 includes a plurality of data structures, algorithms and storage regions, there is no requirement within the context of the present invention that a single memory device as depicted be utilized within the context of the update-stream processing architecture. Specifically, any combination of internal, external and/or associated memory may be utilized to store the software instructions necessary to provide summary generation SG functions, query processor QP functions and summary storage SS functions. Thus, while the architecture depicts the memory as an integral portion of a relatively unified structure, the memory 124 may in fact be distributed internal or external to the update-stream processing architecture 120.

The update-stream processing architecture of FIG. 1 is adapted in one embodiment for Join-Distinct cardinality estimation. Each input stream renders a multi-set of relational tuples (R(A,B) or S(B,C)) as a continuous stream of updates. Note that, in general, even though A, B, and C are denoted as single attributes in the model described herein, they can in fact denote sets of attributes in the underlying relational schema. Furthermore, without loss of generality, it will assumed for convenience that each attribute $X \in \{A,B,C\}$ takes values from the integer domain $[M_X] = \{0, \ldots, M_X-1\}$. Each streaming update (illustratively, for input R(A,B)) is a pair of the form $<(a,b),\pm v>$, where $(a,b) \in [M_A] \times [M_B]$ denotes the specific tuple of R(A,B) whose frequency changes, and $\pm v$ is the net change in the frequency of (a,b) in R(A,B), i.e., "$\pm v$" to ("$-v$") denotes v insertions (resp., deletions) of tuple (a,b). It is assumed that all deletions in the update streams are legal; that is, an update $<(a,b),-v>$ can only be issued if the net frequency of (a,b) in R(A,B) is at least v. Also let N denote an upper bound on the total number of data tuples (i.e., the net sum of tuple frequencies) in either R(A,B) or S(B,C). In contrast to conventional DBMS processing, the inventive stream processor is likely allowed to see the update tuples for each relational input only once and in the fixed order of arrival as they stream in from their respective source(s). Backtracking over an update stream and explicit access to past update tuples are impossible.

The invention finds particular applicability within the context of estimating the number of distinct(A,C) (sub)tuples in the result of the data-stream join $R(A,B) \bowtie_B S(B,C)$. More specifically, in approximating the result of the query $Q = |\pi_{A,C}(R(A,B) \bowtie S(B,C))|$ or, using SQL:

Q = SELECT COUNT DISTINCT (A, C)
    FROM R(A,B), S(B,C)
    WHERE R.B = S.B

The term |X| is used to denote the set cardinality (i.e., number of distinct elements with positive net frequency) in the multi-set X. In general, the attribute sets A, B, and C in Q are not necessarily disjoint or non-empty. For example, the target attributes A and C may in fact contain the join attribute B, and either A or C can be empty (i.e., a one-sided projection). To simplify the discussion, the estimation algorithms assume that both A and C are non-empty and disjoint from B (i.e., $A,C \neq \phi$ and $A \cap B = B \cap C = \emptyset$). The invention is also applicable to other forms of Join-Distinct estimation. With respect to notation, the term A is used as a shorthand to denote the set of distinct A-values seen in R(A,B), and |A| to denote the corresponding set cardinality (i.e., $|A| = |\pi_A(R(A,B))|$). (B,C and |B|,|C| are used similarly, with B being the distinct B-values seen in either R(A,B) or S(B,C), i.e., the union $\pi_B(R(A,B)) \cup \pi_B(S(B,C))$).

Figure 2:
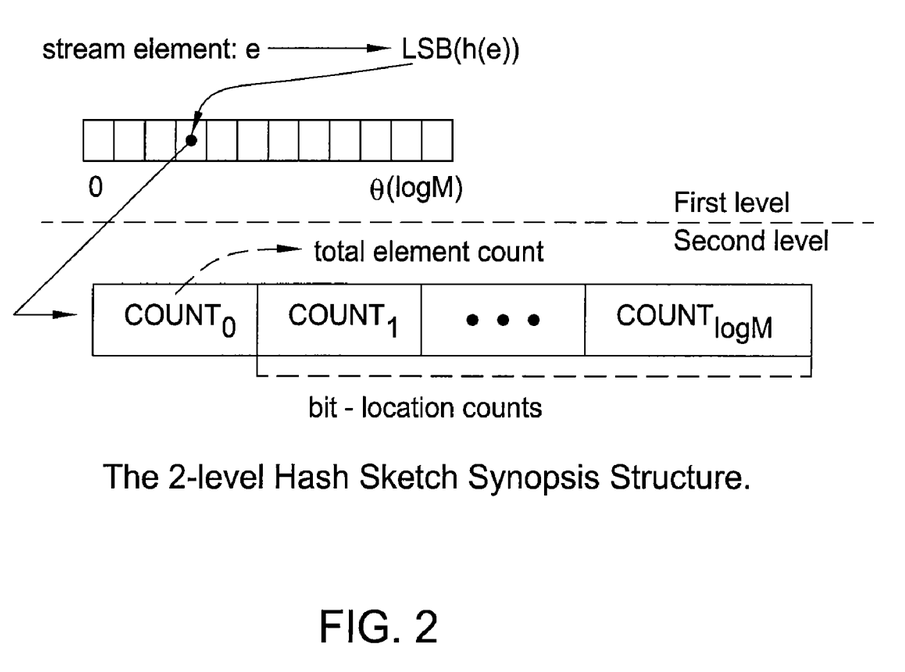
FIG. 2 depicts a data structure of a 2-level hash sketch synopsis useful in understanding the invention.

FIG. 2 depicts a data structure of a 2-level hash sketch update stream synopsis useful in understanding the invention. Specifically, the subject invention utilizes a data structure that includes a 2-level hash sketch stream synopsis. In one embodiment, the 2-level hash sketch stream synopsis is formed according to a modification of a technique developed by Flajolet and Martin (FM). The FM technique proposed the use of hash-based techniques for estimating the number of distinct elements (i.e., |A|) over an insert-only data stream A (i.e., a data stream without deletions or other non-insert updates). Briefly, assuming that the elements of A range over the data domain [M], the FM algorithm relies on a family of hash functions H that map incoming elements uniformly and independently over the collection of binary strings in [M]. It is then easy to see that, if h∈H and (s) denotes the position of the least-significant 1 bit in the binary string s, then for any $$i \in [M], (h(i)) \in \{0, \ldots, \log M - 1\} \text{ and } = \frac{1}{2^{l+1}}.$$

The basic hash synopsis maintained by an instance of the FM algorithm (i.e., a specific choice of hash function h∈H) is simply a bit-vector of size Θ(log M). This bit-vector is initialized to all zeros and, for each incoming value i in the input (multi-)set A, the bit located at position (h(i)) is turned on. Of course, to boost accuracy and confidence, the FM algorithm employs averaging over several independent instances (i.e., r independent choices of the mapping hash-function h∈H and corresponding synopses). The key idea behind the FM algorithm is that, by the properties of the hash functions in H, it is expected that a fraction of $$\frac{1}{2^{l+1}}$$

of the distinct values in A to map to location l in each synopsis; thus, it is expected that |A|/2 values to map to bit 0, |A|/4 to map to bit 1, and so on. Therefore, the location of the leftmost zero (say λ) in a bit-vector synopsis is a good indicator of log|A|, or, $2^\lambda \approx |A|$.

A generalization of the basic FM bit-vector hash synopsis, termed a 2-level hash sketch, enables accurate, small-space cardinality estimation for arbitrary set expressions (e.g., including set difference, intersection, and union operators) defined over a collection of general update streams (ranging over the domain [M], without loss of generality). 2-level hash sketch synopses rely on a family of (first-level) hash functions H that uniformly randomize input values over the data domain [M]; then, for each domain partition created by first-level hashing, a small (logarithmic-size) count signature is maintained for the corresponding multi-set of stream elements.

More specifically, a 2-level hash sketch uses one randomly-chosen first-level hash function h∈H that, as in the FM algorithm, is used in conjunction with LSB operator to map the domain elements in [M] onto a logarithmic range {0, . . . , Θ(log M)} of first-level buckets with exponentially decreasing probabilities. Then, for the collection of elements mapping to a given first-level bucket, a count signature comprising an array of log M+1 element counters is maintained. This count-signature array consists of two parts: (a) one total element count, which tracks the net total number of elements that map onto the bucket; and, (b) log M bit-location counts, which track, for each l=1, . . . , log M, the net total number of elements e with $_l(e)=1$ that map onto the bucket (where, $_l(e)$ denotes the value of the $l^{th}$ bit in the binary representation of e∈[M]). Conceptually, a 2-level hash sketch for a streaming multi-set A can be seen as a two-dimensional array $S_A$ of size Θ(log M)×(log M+1)=Θ(log²M), where each entry $S_A[k,l]$ is a data-element counter of size O(log N) corresponding to the $l^{th}$ count-signature location of the $k^{th}$ first-level hash bucket. Assume that, for a given bucket k, $S_A[k,0]$ is always the total element count, whereas the bit-location counts are located at $S_A[k,1], \ldots, S_A[k, \log M]$. The structure of this 2-level hash sketch synopses is pictorially depicted in FIG. 2.

The algorithm for maintaining a 2-level hash sketch synopsis $S_A$ over a stream of updates to a multi-set A operates as follows. The sketch structure is first initialized to all zeros and, for each incoming update <e,±v>, the element counters at the appropriate locations of the $S_A$ sketch are updated; that is, set $S_A[(h(e)),0]:=S_A[(h(e)),0]±v$ to update the total element count in e's bucket and, for each l=1, . . . , log M such that $_l(e)=1$, set $S_A[(h(e)),l]:=S_A[(h(e)),l]±v$ to update the corresponding bit-location counts. Note here that the 2-level hash sketch synopses are essentially impervious to delete operations; in other words, the sketch obtained at the end of an update stream is identical to a sketch that never sees the deleted items in the stream.

Join-Distinct Synopsis Data Structure

Figure 3:
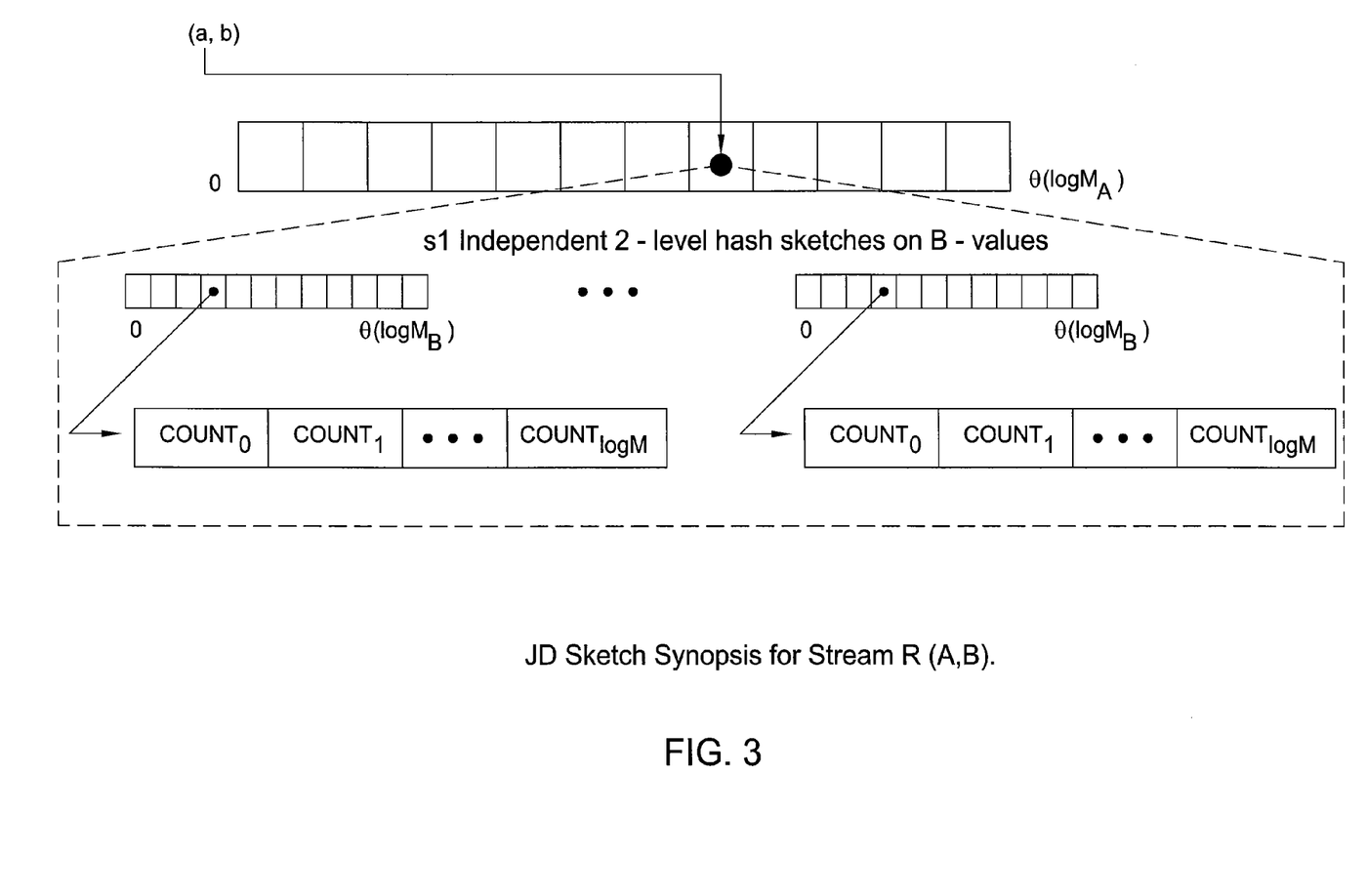
FIG. 3 depicts a data structure of a JD Sketch update stream synopsis according to an embodiment of the invention.

FIG. 3 depicts a data structure of a JD Sketch update stream synopsis according to an embodiment of the invention. Each JD Sketch data structure is associated with one first level hash function and a set of second level hash functions. Multiple JD Sketch data structures are maintained in parallel. That is, each record/tuple is processed according to the requirements of each of the Z JD Sketch data structures. Each respective Z JD Sketch data structure represents a small-space summary of an update data stream.

The JD sketch synopsis data structure for update stream R(A,B) uses hashing on attribute(s) A (similar, in one embodiment, to the basic FM distinct-count estimator) and, for each hash bucket of A, a family of 2-level hash sketches is deployed as a concise synopsis of the B values corresponding to tuples mapped to this A-bucket. More specifically, a JD sketch synopsis $X_{A,B}$ for stream R(A,B) relies on a hash function $h_A$ selected at random from an appropriate family of randomizing hash functions $H_A$ that uniformly randomize values over the domain $[M_A]$ of A. As in the FM algorithm (and 2-level hash sketches), this hash function $h_A$ is used in conjunction with the operator to map A-values onto a logarithmic number of hash buckets {0, . . . , Θ(log $M_A$)} with exponentially-decreasing probabilities. Each such bucket $X_{A,B}[i]$ is an array of $s_1$ independent 2-level hash sketches built on the (multi-)set of B values for (A,B) tuples whose A component maps to bucket i. Let $X_{A,B}[i,j]$ ($1 \leq j \leq s_1$) denote the $i^{th}$ 2-level hash sketch on B for the $i^{th}$ A bucket. One aspect of the JD sketch definition is that the B hash functions ($h_B$) used by the $i^{th}$ 2-level hash sketch in $X_{A,B}$ are, in one embodiment, identical across all A buckets. That is, $X_{A,B}[i_1,j]$ and $X_{A,B}[i_2,j]$ use the same (first-level) hash functions on B for any $i_1,i_2$ in {0, . . . , Θ(log $M_A$)}.

As with 2-level hash sketches, conceptually, a JD sketch $X_{A,B}$ for the update stream R(A,B) can be seen as a four-dimensional array of total size Θ(log $M_A$)×$s_1$×Θ(log $M_B$)× (log $M_B$+1)=$s_1$·Θ(log $M_A$ log²$M_B$), where each entry $X_{A,B}[i,j,k,l]$ is a counter of size O(log N). The JD sketch structure is pictorially depicted in FIG. 3. It should be noted that a JD sketch $X_{A,B}$ can be thought of as a three-level hash sketch where the first level of hashing is on attribute(s) A, and a subsequent set of 2-level hash sketches on the B attribute(s).

The maintenance algorithm for a JD sketch synopsis built over the R(A,B) stream operates as follows. All counters in the data structure are initialized to zeros and, for each incoming update $<(a,b),\pm v>$ (where $(a,b)\in[M_A]\times[M_B]$), the a value is hashed using $h_A()$ to locate an appropriate A-bucket, and all the 2-level hash sketches in that bucket are then updated using the $<b,\pm v>$ tuple; that is, each of the $s_1$ 2-level hash sketches $X_{A,B}[h_A(a),j]$ (i=1, ..., $s_1$) is updated with $<b,\pm v>$ using the 2-level hash sketch maintenance algorithm described herein.

Join-Distinct Estimator

A Join-Distinct estimation algorithm according to an embodiment of the invention constructs several independent pairs of parallel JD sketch synopses ($X_{A,B}$, $X_{C,B}$) for the input update streams R(A,B) and S(B,C) (respectively). For the $X_{C,B}$ sketch, attribute C plays the same role as attribute A in $X_{A,B}$ (i.e., it is used to determine a first-level bucket in the JD sketch). Furthermore, both $X_{A,B}$ and $X_{C,B}$ use exactly the same hash functions for B in corresponding 2-level hash sketches for any A or C bucket; that is, the B-hash functions for $X_{A,B}[*,j]$ and $X_{C,B}[*,j]$ are identical for each i=1, ..., $s_1$ (here, "*" denotes any first-level bucket in either of the two JD sketches). Then, at estimation time, each such pair of parallel JD sketches is composed in a novel manner to build a synopsis for the number of distinct (A,C) pairs in the join result. This composition is novel and non-trivial, and relies on the use of new, composable families of hash functions ($h_A()$ and $h_C()$) for the first level of a JD sketch synopses. The basic JD sketch composition step will now be described in detail.

Composing a Parallel JD Sketch Pair.

Consider a pair of parallel JD sketch synopses ($X_{A,B}$, $X_{C,B}$) over R(A,B) and S(B,C). The goal of the JD sketch composition step is to combine information from $X_{A,B}$ and $X_{C,B}$ to produce a bitmap synopsis for the number of distinct (A,C) value pairs. This bitmap is built using only (A,C) pairs in the result of the join R⋈S. Thus, the composition step uses $X_{A,B}$ and $X_{C,B}$ to determine (with high probability) the (A,C)-value pairs that belong in the join result, and map such pairs to the cells of a bitmap $Y_{A,C}$ of logarithmic size (i.e., $O(\log M_A + \log M_C)$) with exponentially-decreasing probabilities.

Figure 4:
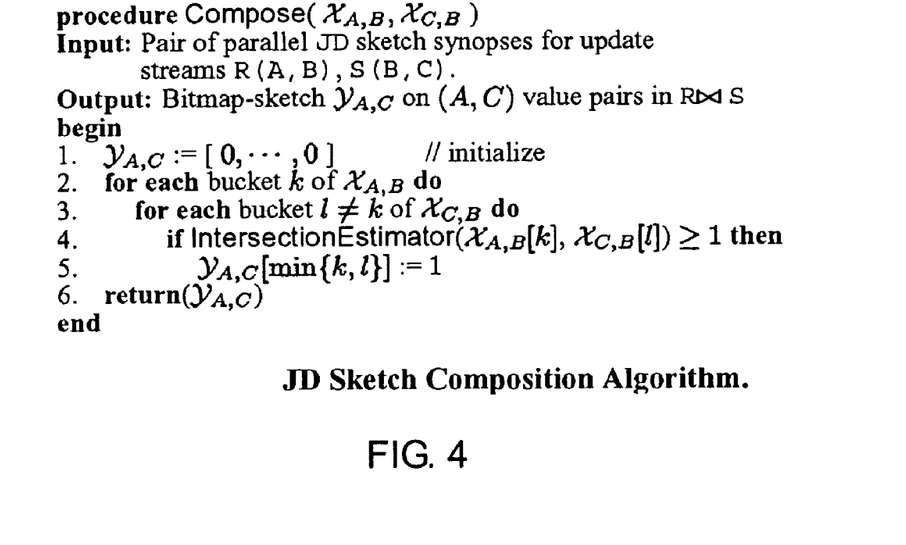
FIG. 4 depicts a pseudo code representation of a method according to an embodiment of the invention for composing parallel JD Sketch data structures.

FIG. 4 depicts a pseudo code representation of a method for composing parallel JD Sketch data structures. The JD sketch composition algorithm of FIG. 4, termed Compose considers all possible combinations of fist level bucket indices k≠l from the two input parallel JD sketches (the k≠l restriction comes from a technical condition on the composition of the two first-level hash functions on A and C). For each such bucket pair $X_{A,B}[k]$ and $X_{C,B}[l]$, the composition algorithm employs the corresponding 2-level hash sketch synopses on B to estimate the size of the intersection for the sets of B values mapped to those first-level buckets (procedure IntersectionEstimator in Step 4). If that size is estimated to be greater than zero (i.e., the two buckets share at least one common join-attribute value), then the bit at location min{k,l} of the output (A,C)-bitmap $Y_{A,C}$ is set to one (Step 5). Since the JD sketches do not store the entire set of B values for each first-level bucket but, rather, a concise collection of independent 2-level hash sketch synopses, the decision of whether two first-level buckets join is necessarily approximate and probabilistic (based on the 2-level hash sketch intersection estimate).

The JD sketch composition algorithm implements a composite hash function $h_{A,C}()$ over (A,C)-value pairs that combines the first-level hash functions $h_A()$ and $h_C()$ from sketches $X_{A,B}$ and $X_{C,B}$, respectively.

The composite hash function and its properties will now be examined in more detail. The ability to use the final (A,C) bitmap synopsis $Y_{A,C}$ output by algorithm Compose to estimate the number of distinct (A,C)-value pairs in R(A,B)⋈(B,C) depends on designing a composite hash function $h_{A,C}()$ (based on the individual functions $h_A()$, $h_C()$) that guarantees certain randomizing properties similar to those of the hash functions used in the 2-level hash sketch estimators. More specifically, the composite hash function $h_{A,C}()$ preferably (a) allows mapping of (A,C)-value pairs onto a logarithmic range with exponentially-decreasing probabilities, and (b) guarantees a certain level of independence between distinct tuples in the (A,C)-value pair domain. The key problem is that, since the tuples from R(A,B) and S(B,C) are seen in arbitrary order and are individually summarized in the $X_{A,B}$ and $X_{C,B}$ synopses, the composite hash-function construction can only use the hash values ($h_A()$) and ($h_C()$) maintained in the individual JD sketches. This limitation makes the problem non-trivial, since it reduces the efficacy of standard pseudo-random hash-function constructions, such as using finite-field polynomial arithmetic over $[M_A]\times[M_C]$.

The inventors have established the existence of composable hash-function pairs ($h_A()$, $h_C()$) and demonstrate that, for such functions, the composition procedure in algorithm Compose indeed guarantees the required properties for the resulting composite hash function (i.e., exponentially-decreasing mapping probabilities as well as pair wise independence for (A,C)-value pairs).

Specifically, the hash functions ($h_A()$,$h_C()$) used to build a parallel JD sketch pair ($X_{A,B}$,$X_{C,B}$) can be constructed so that the hash-function composition procedure in algorithm Compose: (1) guarantees that (A,C)-value pairs are mapped onto a logarithmic range $\Theta(\log \max\{M_A,M_C\})$ with exponentially-decreasing probabilities (in particular, the mapping probability for the $i^{th}$ bucket is $p_i=\Theta(4^{-(i+1)})$); and, (2) results in a composite hash function $h_{A,C}()$ that guarantees pair wise independence in the domain of (A,C)-value pairs.

The Join-Distinct Estimator.

Figure 5:
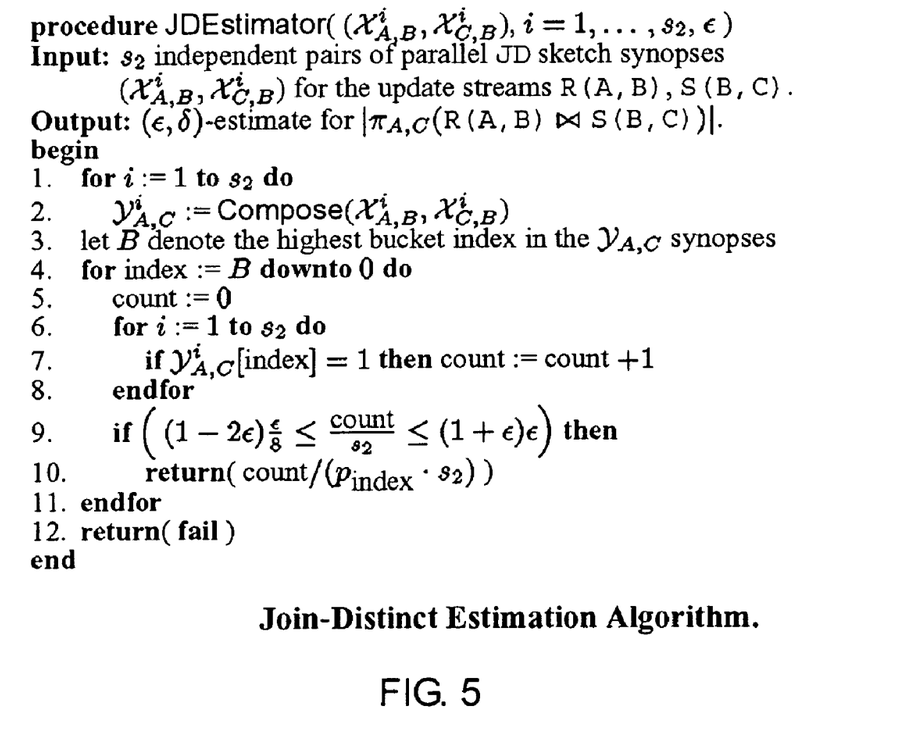
FIG. 5 depicts a pseudo code representation of a Joint-Distinct estimation method according to an embodiment of the invention.

FIG. 5 depicts a pseudo code representation of a Joint-Distinct estimation method according to an embodiment of the invention. Specifically, FIG. 5 depicts the pseudo-code of an algorithm for producing an ($\epsilon,\delta$) probabilistic estimate for the Join-Distinct problem (termed JDEstimator). Briefly, the estimator employs an input collection of $s_2$ independent JD sketch synopsis pairs built in parallel over the input update streams R(A,B) and S(B,C). Each such parallel JD sketch pair ($X^i_{A,B},X^i_{C,B}$) is first composed (using algorithm Compose) to produce a bitmap synopsis $Y^i_{A,C}$ over the (A,C)-value pairs in the join result (Steps 1-2). Then, the resulting $s_2$ $Y^i_{A,C}$ bitmaps are examined level-by-level in parallel, searching for the highest bucket level ("index") at which the number of bitmaps that satisfy the condition: "$Y^i_{A,C}[\ ]=1$", lies between $$s_2 \cdot (1-2\epsilon)\frac{\epsilon}{8} \text{ and } s_2 \cdot (1+\epsilon)\epsilon \text{ (Steps 4-11)}.$$

The final estimate returned is equal to the fraction of $Y^i_{A,C}$ synopses satisfying the condition at level "index" (i.e., "count/$s_2$") scaled by the mapping probability for that level $p=\Theta(4^{-(+1)})$.

The inventors have established that for appropriate settings of the JD Sketch synopsis parameter $s_1$ and $s_2$, the join-distinct estimation procedure can guarantee low relative error with high probability. Specifically, let $S_p$ denote a random sample of distinct (A,C)-value pairs drawn from the Cartesian product $[M_A]\times[M_C]$ of the underlying value domains, where each possible pair is selected for inclusion in the sample with probability p. Also, define two additional random variables $U_p$ and $T_p$ over the sample $S_p$ of (A,C)-value pairs as follows:

Up=|{b: ∃(a,c)∈Sp such that [(a,b) ∈R(A,B) OR (b,c) ∈S(B,C)]}|,

Tp=|{b: ∃(a,c)∈Sp such that [(a,b) ∈R(A,B) AND (b,c) ∈S(B,C)]}|.

The following theorem summarizes the results of the analysis, using $M=\max\{M_A, M_B, M_C\}$ to simplify the statement of the worst-case space bounds:

Let m denote the result size of an input query on two update streams R(A,B) and S(B,C), and let $$M = \max\{M_A, M_B, M_C\}, \ e(p) = E\left[\frac{Up}{Tp} | Tp \geq 1\right], \text{ where } p = \frac{\epsilon}{m}.$$

The algorithm JDEstimator returns an $(\epsilon, \delta)$-estimate (i.e., an estimate that is within an $\epsilon$ relative error of the correct answer with probability at least $1-\delta$) for m using JD Sketch synopses with a total storage requirement of $\Theta(s_1 s_2 \log^3 M \log N)$ and per-tuple update time of $$\Theta(s_1 \log M), \text{ where: } s_1 = \Theta\left(\frac{e(p)\log(1/\delta)}{\epsilon}\right) \text{ and } s_2 = \Theta\left(\frac{\log(1/\delta)}{\epsilon^3}\right).$$

Extensions

Handling Other Forms of Join-Distinct Count Queries. The discussion thus far has focused on the query $Q=|\pi_{A,C}(R(A,B) \bowtie S(B,C))|$, where $A, C \neq \phi$ and $A \cap B = B \cap C = \phi$). The Join-Distinct estimation techniques can be adapted to deal with other forms of Join-Distinct COUNT queries conforming to the general query pattern described herein.

Consider the case of a one-sided projection query $Q'=|\pi_{A,B}(R(A,B) \bowtie S(B,C))|$, where the estimate of the number of distinct R(A,B) tuples joining with at least one tuple from S(B,C) (i.e., the number of distinct tuples in a stream semi-join) is sought. The JDEstimator algorithm can readily handle the estimation of Q' by replacing attribute C with B in the JD sketch construction and estimation steps already described for Q. Thus, for Q', the JD sketch synopsis built on the S(B,C) side uses a first-level hash function on attribute B in addition to the per-bucket 2-level hash sketch collections (also built on B); then, when the JD sketch composition process is applied (at estimation time), the output is a set of bitmap synopses $Y_{A,B}$ on (A,B)-value pairs that is used to produce an estimate for Q'.

Similarly consider the case of a "full-projection" query $Q''=|\pi A, B, C(R(A,B) \bowtie S(B,C))|$ that simply outputs the number of distinct (A,B,C) tuples in the join result. Handling Q" involves replacing A(C) by (A,B) (resp., (B,C)) in the JD sketch construction and JDEstimator algorithms for Q. The results of the analysis for the estimators can also be readily extended to cover these different forms of Join-Distinct estimation problems.

The Join-Distinct estimation algorithms described thus far have primarily utilized logarithmic or polylogarithmic space requirements. Such a restriction makes sense, for example, when joining on attributes with very large numbers of distinct values (e.g., (source, destination) IP-address pairs). When this is not the case, and using $\Theta(|B|)$ space is a viable option for estimating $Q=|\pi_{A,C}(R(A,B) \bowtie S(B,C))$, an alternative Join-Distinct estimation algorithm may be used. Briefly, the alternative algorithm again relies on the idea of using composable hash functions to compose a bit-vector sketch on (A,C) from hash sketches built individually on R(A,B) and S(B,C); however, the synopsis structure used is different from that of JDEstimator. More specifically, by making use of a $\Theta(|B|)$ bit-vector indicating the existence of a particular B value in an input stream; for each non-empty B-bucket, a collection of independent FM synopses (using counters instead of bits) is maintained that summarizes the collection of distinct A(C) values for tuples in R(A,B) (resp., S(B,C)) containing this specific B-value. (These FM synopses are built using composable hash functions $h_A(\ )$ and $h_C(\ )$, as discussed above. At estimation time, the A and C synopses for each B-value that appears in both R(A,B) and S(B,C) (note that, since by using $\Theta(|B|)$ space, this co-occurrence test is now exact) are composed to produce an (A,C)-bitmap sketch for that B-value. Then, all such (A,C)-bitmaps are unioned (by bitwise OR-ing) to give bit-vectors on (A,C) for the result of $R \bowtie S$, that can be directly used for estimating Q. This alternative Join-Distinct estimator can produce an $(E, \delta)$-estimate for Q using $$\Theta\left(|B|\log\left(\frac{1}{\delta}\right)/\epsilon^3\right)$$

space, and can be extended to handle other forms of Join-Distinct queries (like Q' and Q" above).

The above-described invention provides a methodology for summarizing a continuous stream of tuple updates using the JD Sketch data structure. Multiple JD Sketch data structure may be used to summarize a tuple update stream, where each of the JD Sketch data structures is computed using a respective base attribute. Two (or more) tuple update streams may be summarized in parallel using respective multiple JD Sketch data structures, where pairs (i.e., one associated with each stream and having a common attribute) of JD Sketch data structures are maintained in parallel. The parallel JD Sketch data structures enable rapid approximations in response to join-distinct queries by performing a join operation and then applying a duplicate elimination step to count the number of distinct tuples produced by the join operation.

While the forgoing is directed to various embodiments of the present invention, other and further embodiments of the invention may be devised without departing from the basic scope thereof. As such, the appropriate scope of the invention is to be determined according to the claims, which follow.

The invention claimed is:

1. A method, comprising:
  maintaining a summary of a first continuous stream of tuple updates, comprising:
    hashing tuples received from said first continuous tuple update stream according to at least one first initial attribute; and
    for each bucket of said at least one first initial attribute, generating a corresponding first set of 2-level hash sketches according to at least one first other attribute; and
  storing said summary of said first continuous tuple update stream.

2. The method of claim 1, further comprising:
  maintaining a summary of a second continuous stream of tuple updates, comprising:
    hashing tuples received from said second continuous tuple update stream according to at least one second initial attribute; and
    for each bucket of said at least one second initial attribute, generating a corresponding second set of 2-level hash sketches according to at least one second other attribute; and storing said summary of the second continuous tuple update stream.

3. The method of claim 2, wherein:
said at least one first other attribute and said at least one second initial attribute are the same.

4. The method of claim 3, wherein:
each of said summaries of said first and second continuous tuple update streams utilize a plurality of corresponding attributes to provide thereby a plurality of parallel JD Sketch synopsis.

5. The method of claim 4, further comprising:
composing at least one pair of parallel JD Sketch synopsis to produce a bitmap synopsis for a number of distinct value pairs in a join result of the tuple update streams.

6. The method of claim 4, further comprising:
composing each of a plurality of pairs of parallel JD Sketch synopsis to produce respective bitmap synopsis for a number of distinct value pairs in a join result of the tuple update streams; and
examining said bitmaps in parallel to find a highest bucket level at which the number of bitmaps satisfies a predetermined condition to estimate the size of a join distinct count.

7. A computer readable storage medium containing a program which, when executed, performs an operation comprising:
maintaining a summary of a first continuous stream of tuple updates, comprising:
hashing tuples received from said first continuous data stream according to at least one first initial attribute; and
for each bucket of said at least one first initial attribute, generating a corresponding first set of 2-level hash sketches according to at least one first other attribute; and
storing said summary of said first continuous tuple update stream.

8. The computer readable storage medium of claim 7, wherein the operation further comprises:
maintaining a summary of a second continuous stream of tuples, comprising:
hashing tuples received from said second continuous data stream according to at least one second initial attribute; and
for each bucket of said at least one second initial attribute, generating a corresponding second set of 2-level hash sketches according to at least one second other attribute; and
storing said summary of the second continuous tuple update stream.

9. The computer readable storage medium of claim 8, wherein:
said at least one first other attribute and said at least one second initial attribute are the same.

10. The computer readable storage medium of claim 9, wherein:
each of said summaries of said first and second continuous tuple update streams utilize a plurality of corresponding attributes to provide thereby a plurality of parallel JD Sketch synopsis.

11. The computer readable storage medium of claim 10, wherein the operation further comprises:
composing at least one pair of parallel JD Sketch synopsis to produce a bitmap synopsis for a number of distinct value pairs in a join result of the tuple update streams.

12. The computer readable storage medium of claim 10, wherein the operation further comprises: composing each of a plurality of pairs of parallel JD Sketch synopsis to produce respective bitmap synopsis for a number of distinct value pairs in a join result of the tuple update streams; and
examining said bitmaps in parallel to find a highest bucket level at which the number of bitmaps satisfies a predetermined condition to estimate the size of a join distinct count.

13. A method, comprising:
maintaining a summary of a first continuous stream of tuples, comprising:
hashing tuples received from said first continuous tuple stream according to at least one first initial attribute of said first continuous tuple stream to map values of said attribute into a plurality of first initial attribute buckets; and
for each bucket of said first initial attribute buckets, generating a corresponding first set of 2-level hash sketches according to at least one first other attribute of said fist continuous tuple stream; and
storing said summary of said first continuous tuple stream.

14. The method of claim 13, further comprising:
maintaining a summary of a second continuous stream of tuples, comprising:
hashing tuples received from said second continuous tuple stream according to at least one second initial attribute; and
for each bucket of said at least one second initial attribute, generating a corresponding second set of 2-level hash sketches according to at least one second other attribute; and
storing said summary of the second continuous tuple stream.

15. The method of claim 14, wherein:
each of said summaries of said first and second continuous tuple streams utilize a plurality of corresponding attributes to provide thereby a plurality of parallel JD Sketch synopsis.

* * * * *

UNITED STATES PATENT AND TRADEMARK OFFICE
CERTIFICATE OF CORRECTION

| | | |
|---|---|---|
| PATENT NO. | : 7,668,856 B2 | Page 1 of 1 |
| APPLICATION NO. | : 10/957185 | |
| DATED | : February 23, 2010 | |
| INVENTOR(S) | : Ganguly et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1079 days.

Signed and Sealed this

Twenty-eighth Day of December, 2010

David J. Kappos
*Director of the United States Patent and Trademark Office*